United States Patent
Morimoto et al.

(10) Patent No.: US 9,443,724 B2
(45) Date of Patent: Sep. 13, 2016

(54) MODIFICATION PROCESSING METHOD AND METHOD OF MANUFACTURING SEMICONDUCTOR DEVICE

(71) Applicant: TOKYO ELECTRON LIMITED, Tokyo (JP)

(72) Inventors: Tamotsu Morimoto, Nirasaki (JP); Yusuke Muraki, Nirasaki (JP); Kazuaki Nishimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/725,656

(22) Filed: May 29, 2015

(65) Prior Publication Data

US 2015/0357187 A1     Dec. 10, 2015

(30) Foreign Application Priority Data

Jun. 9, 2014    (JP) ................................. 2014-118271

(51) Int. Cl.
*H01L 21/311*     (2006.01)
*H01L 21/02*     (2006.01)
*H01L 21/768*     (2006.01)

(52) U.S. Cl.
CPC ... *H01L 21/02334* (2013.01); *H01L 21/02164* (2013.01); *H01L 21/02238* (2013.01); *H01L 21/02337* (2013.01); *H01L 21/76892* (2013.01)

(58) Field of Classification Search
CPC .................. H01L 21/76892; H01L 21/02334; H01L 21/02614; H01L 21/02238; H01L 21/31111
USPC .................................................. 438/750, 756
See application file for complete search history.

(56) References Cited

U.S. PATENT DOCUMENTS

2004/0180556 A1*   9/2004   Chiang ............... H01L 21/3105 438/781
2012/0083127 A1     4/2012   Clark

* cited by examiner

*Primary Examiner* — Long K Tran
(74) *Attorney, Agent, or Firm* — Nath, Goldberg & Meyer; Jerald L. Meyer

(57) ABSTRACT

A modification processing method includes preparing a substrate having a silicon layer on which a damage layer is formed through plasma processing. The method further includes removing the damage layer formed on the silicon layer by processing the substrate with a first process gas containing a fluorine gas.

17 Claims, 14 Drawing Sheets

FIG. 11

| | High pressure step (1) | Low pressure step (1) | High pressure step (2) | Low pressure step (2) | . . . |
|---|---|---|---|---|---|
| $F_2$ ON/OFF | ON | ON | ON | ON | - - - |
| Ar ON/OFF | ON | ON | ON | ON | - - - |
| $NH_3$ ON/OFF | ON | ON | ON | ON | - - - |
| Process pressure High/low | High | low | High | low | - - - |

$t_1 \quad t_2 \quad t_3 \quad t_4 \quad t_5$

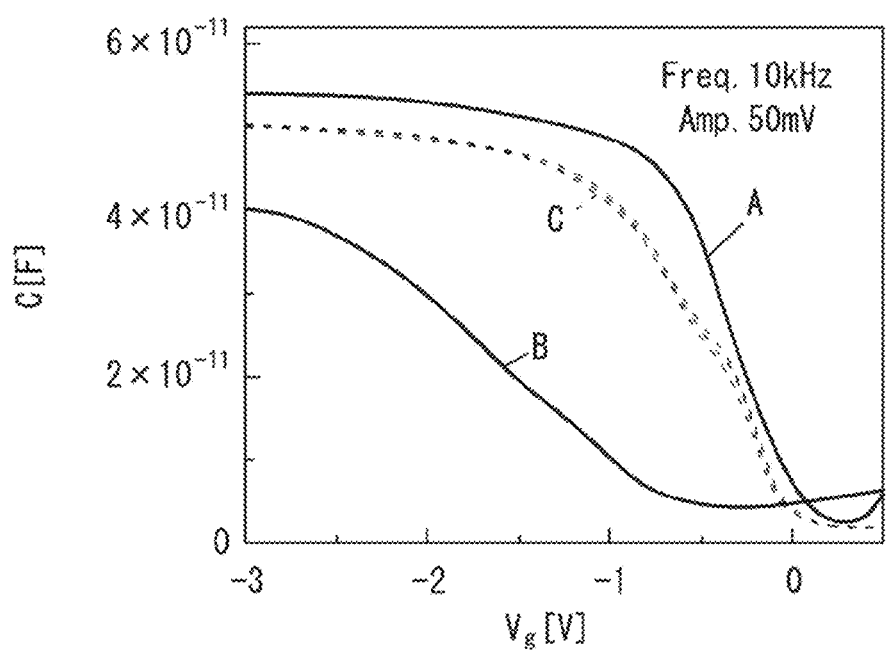

MODIFICATION PROCESSING METHOD AND METHOD OF MANUFACTURING SEMICONDUCTOR DEVICE

CROSS-REFERENCE TO RELATED APPLICATION

This application claims the benefit of Japanese Patent Application No. 2014-118271, filed on Jun. 9, 2014, in the Japan Patent Office, the disclosure of which is incorporated herein in its entirety by reference.

TECHNICAL FIELD

The present disclosure relates to a modification processing method of recovering damage on a substrate such as, e.g., a semiconductor wafer, and a method of manufacturing a semiconductor device using the same.

BACKGROUND

In a process of manufacturing a semiconductor substrate, a flat panel display (FPD) represented by a liquid crystal display (LCD), a solar cell, or the like, plasma processing such as etching or film formation using plasma on the substrate is performed. However, such plasma processing has been known to leave a damage layer in a silicon layer. For example, a Fin channel (a silicon standing wall) of a Fin-type channel field effect transistor (FinFET), which is a next-generation three-dimensional (3D) device, may be formed through plasma etching with high anisotropy. It is considered that, during the plasma etching process, ions perpendicularly and anisotropically coming in collide with a substrate so as to spread in multiple directions, thereby leaving plasma damage even on sidewalls of the Fin channel.

In order to recover the damage layer formed on the silicon layer due to the plasma processing, or the like, a method of performing an annealing process at a high temperature ranging from about 900 to 1000 degrees C. for a long time or a method of first forming a sacrificial oxide film by thermally oxidizing silicon in a depth equal to or deeper than that of the damage layer and then removing the sacrificial oxide film by a liquid chemical having selectivity with respect to an underlayer has been employed. However, any of the methods requires heat treatment at a high temperature and this causes an increase in thermal budget. Further, in the latter method, there is a possibility that a fine pattern formed on a substrate collapses during the processing with the liquid chemical (so-called pattern collapse). Thus, in the process of manufacturing a next-generation device including a 3D device, there is a high possibility that it is difficult to apply an annealing process or a sacrificial oxidizing process at high temperatures for a long time for the purpose of recovering plasma damage. Moreover, removing damage from a fine pattern such as a Fin channel requires dimension controllability with high precision.

On the other hand, as a method of forming a fine pattern that can be used in a 3D structure transistor, or the like on a semiconductor substrate, a method of repeatedly performing a process of forming a thin oxide film on a surface of a silicon pattern formed through anisotropy etching and a process of removing the oxide film by exposing it to a mixture gas of HF and $NH_3$ has been proposed in the related art.

SUMMARY

Some embodiments of the present disclosure provide a method capable of effectively removing plasma damage from a substrate without increasing a thermal budget or causing pattern collapse.

According to some embodiments of the present disclosure, provided is a modification processing method, including: preparing a substrate having a silicon layer on which a damage layer is formed through plasma processing; and removing the damage layer formed on the silicon layer by processing the substrate with a first process gas containing a fluorine gas.

According to some embodiments of the present disclosure, provided is a method of manufacturing a semiconductor device including the aforementioned modification processing method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 11 is a timing chart illustrating introduction of a process gas and a change in a process pressure in a process of a modification processing method according to a second embodiment of the present disclosure.

FIG. 14 is a view illustrating CV characteristics of a MOS capacitor manufactured from samples of Embodiment 1, Comparative Example 1, and Embodiment 2.

DETAILED DESCRIPTION

Figure 1:
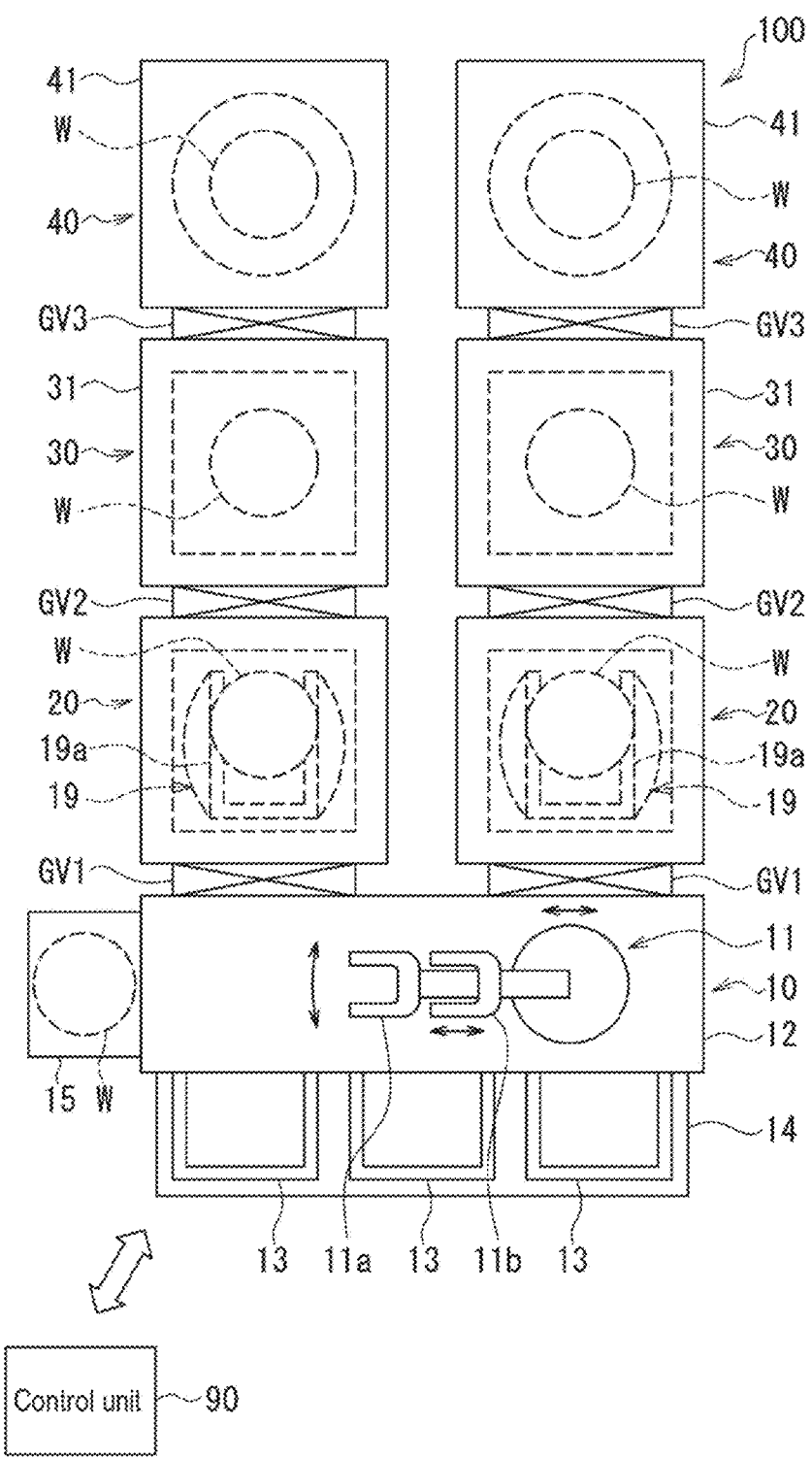
FIG. 1 is a view schematically illustrating a configuration of a substrate processing system that may be used in a modification processing method according to an embodiment of the present disclosure.

Hereinafter, embodiments of the present disclosure will be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. FIG. 1 is a view schematically illustrating a configuration of a substrate processing system that may be used in a modification processing method according to an embodiment of the present disclosure. The substrate processing system 100 includes a loading/unloading device 10 for loading and unloading a semiconductor wafer (hereinafter, referred to as a "wafer") W, two load lock devices 20 installed adjacent to the loading/unloading device 10, two post heat treatment (PHT) devices 30 for performing PHT on wafers W, and two modification processing devices 40 for performing modification on the wafers W. The load lock devices 20, the PHT devices 30, and the modification processing devices 40 are arranged and installed in this order. That is, each of the PHT devices 30 is installed adjacent to each of the load lock devices 20, and each of the modification processing devices 40 is installed adjacent to each of the PHT devices 30.

<Loading/Unloading Device>

The loading/unloading device 10 loads or unloads the wafers W between the substrate processing system 100 and an external device by an atmospheric side wafer transfer device 11. The loading/unloading device 10 has a transfer chamber 12. The atmospheric side wafer transfer device 11 is installed within the transfer chamber 12. The atmospheric side wafer transfer device 11 has two transfer arms 11a and 11b that substantially horizontally hold the wafer W. A carrier loading table 14 on which carriers 13 capable of accommodating a plurality of wafers W are loaded is installed on the side of the transfer chamber 12 in a lengthwise direction. A plurality of carriers 13 (three carriers in FIG. 1) are loaded on the carrier loading table 14. Further, an orienter 15 for aligning a position of the wafers W is installed adjacent to the transfer chamber 12.

In the loading/unloading device 10, the wafers W are held by the transfer arms 11a and 11b of the atmospheric side wafer transfer device 11. And, the wafers W are transferred to desired positions by driving the atmospheric side wafer transfer device 11. Specifically, the wafers W are loaded and unloaded by moving the transfer arms 11a and 11b forwards or backwards with respect to each of the carriers 13 on the carrier loading table 14, the orienter 15, and the load lock device 20.

<Load Lock Device>

The two load lock devices 20 are each connected to the transfer chamber 12 such that the transfer of the wafers W can be available between them. Gate valves GV1 are interposed between each of the load lock devices 20 and the transfer chamber 12. Wafer transfer devices 19 for transferring the wafers W are installed within the load lock devices 20, respectively. Further, the load lock devices 20 are configured such that it can be vacuumized up to a predetermined degree of vacuum.

Each of the wafer transfer devices 19 has an arm (not shown) having a multi-joint structure and a hand 19a connected to the arm and holding the wafer W substantially horizontally. The wafer transfer devices 19 are configured such that the hand 19a is positioned within the load lock device 20 when the arm having the multi-joint structure is in its most retracted position while the hand 19a can reach the interior of the PHT device 30, further, the interior of the modification processing device 40 when the arm having the multi joint structure is lengthened. Thus, the wafer transfer devices 19 can transfer the wafers W between the load lock device 20, the PHT device 30, and the modification processing device 40 by extending and contracting the arm having the multi joint structure in a state in which the wafer W is loaded on the hand 19a.

<PHT Device>

Figure 2:
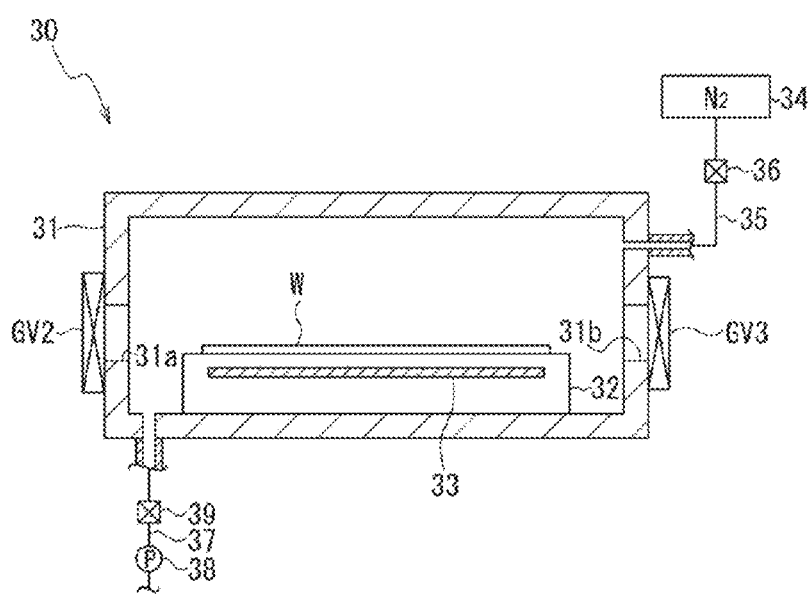
FIG. 2 is a cross-sectional view illustrating a PHT device in the substrate processing system of FIG. 1.

The PHT device 30 has a process container 31 that can be vacuumized and a loading table 32 for loading a wafer W thereon in the process container 31, as illustrated in FIG. 2. A heater 33 is embedded in the loading table 32. The PHT process in which the wafer W, which has been subjected to the modification process, is heated to vaporize (sublimate) a reaction product generated through the modification process can be performed by the heater 33.

An inlet/outlet 31a is formed at the load lock device 20 side of the process container 31 to transfer the wafer W between the process container 31 and the load lock device 20. The inlet/outlet 31a can be opened and closed by a gate valve GV2. Further, an inlet/outlet 31b is formed at the modification processing device 40 side of the process container 31 in order to transfer the wafer W between the process container 31 and the modification processing device 40. The inlet/outlet 31b can be opened and closed by a gate valve GV3.

The PHT device 30 further has a gas supply source 34 for supplying an inert gas such as, e.g., a nitrogen gas ($N_2$) to the process container 31. The gas supply source 34 is connected to the process container 31 through a gas supply path 35. Further, a flow rate regulating valve 36 which can open and close a flow path and regulate a supply flow rate of the nitrogen gas is installed in the gas supply path 35.

The PHT device 30 also has an exhaust path 37 for evacuating the interior of the process container 31, a vacuum pump 38 connected to the exhaust path 37, and a switching valve 39 installed in the middle of the exhaust path 37.

<Modification Processing Device>

Figure 3:
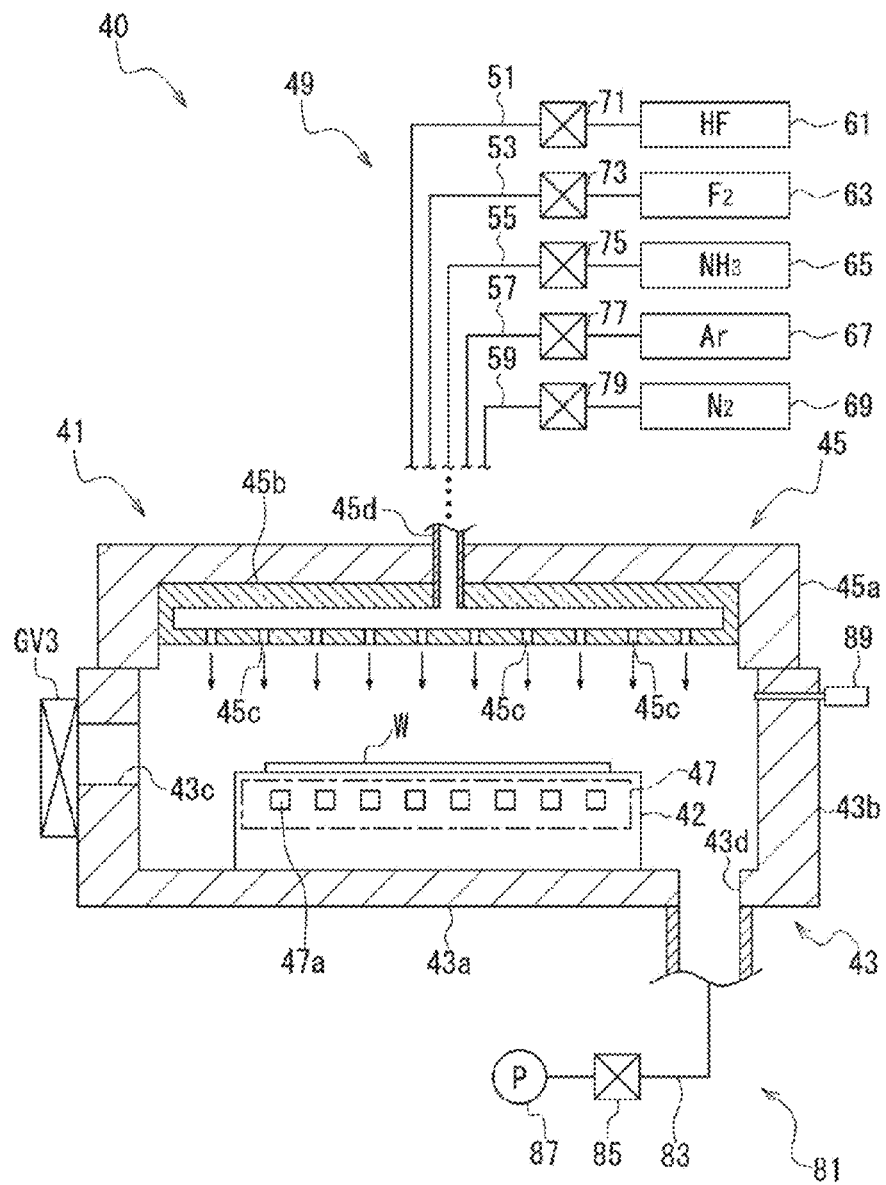
FIG. 3 is a cross-sectional view schematically illustrating a configuration of a modification processing device in the substrate processing system of FIG. 1.

As illustrated in FIG. 3, the modification processing device 40 has an airtight process container 41. A loading table 42 for loading a wafer W in a substantially horizontal state is installed inside the process container 41.

The process container 41 has a container body 43 and a lid 45. The container body 43 has a bottom portion 43a and a substantially cylindrical sidewall 43b. A lower portion of the sidewall 43b is blocked by the bottom portion 43a, while an upper portion of the sidewall 43b is opened. The opened upper portion is closed by the lid 45. The sidewall 43b and the lid 45 are sealed by a seal member (not shown), thereby securing airtightness of the interior of the process container 41. The process container 41 and the lid 45 may be formed of a material, e.g., aluminum. An anodic oxidized aluminum may be used on an inner surface of the container body 43 in some embodiments.

As illustrated in FIG. 3, an inlet/outlet 43c is formed on the sidewall 43b to allow the wafer W to be transferred between the process container 31 of the PHT device 30 and the modification processing device 40. The inlet/outlet 43c can be opened and closed by the gate valve GV3. The process container 41 is connected to the process container 31 of the PHT device 30 through the gate valve GV3, to enable the transfer of the wafer W.

The lid 45 has a lid body 45a and a shower head 45b for injecting a process gas. The shower head 45b is installed below the lid body 45a. That is, the shower head 45b is installed above the loading table 42, and a lower surface of the shower head 45b functions as an inner surface (lower surface) of the lid 45. A plurality of injection holes 45c is formed on the lower surface of the shower head 45b in order to inject a gas, and is configured to supply various gases to the wafer W on the loading table 42 from above. The shower head 45b is formed of, e.g., aluminum, and a lower surface of the shower head 45b is subjected to the anodic oxidation treatment in some embodiments. Further, the shower head 45b has one or more gas introduction portions 45d (only one is illustrated).

The loading table 42 has a substantially circular shape when viewed from a plan view, and is fixed to the bottom portion 43a. The loading table 42 may be formed of a material such as, e.g., aluminum. In order to increase wear resistance, a surface of the loading table 42 has an oxide film ($Al_2O_3$) by, e.g., the anodic oxidation treatment thereon. A temperature adjusting unit 47 for adjusting a temperature of the loading table 42 is installed inside the loading table 42. The temperature adjusting unit 47 has a flow path 47a through which a heating medium such as, e.g., water, circulates. Through heat exchange with the heating medium flowing within the flow path 47a, a temperature of the loading table 42 can be adjusted and thus a temperature of the wafer W on the loading table 42 can be adjusted.

Further, the modification processing device 40 has a gas supply mechanism 49 for supplying a process gas to the process container 41. Then, the process gas introduced into the process container 41 is maintained at a predetermined pressure and is contacted with the wafer W to act on an oxide film ($SiO_2$) or a damage layer formed on the wafer W.

When a process target is an oxide film, ammonium silicofluoride [$(NH_4)_2SiF_6$] as a reaction product is generated by using a process gas containing an HF gas and $NH_3$. An oxide film that is a process target may be a naturally oxidized film formed on a surface of the wafer W or may be an oxide film forming a device.

In a case in which a process target is a damage layer formed in a silicon layer, $SiF_4$ or the like is generated as a reaction product by using a process gas containing $F_2$ and, if necessary, $NH_3$, $N_2$, Ar, or the like. The damage layer may be a damage layer formed in a silicon layer through, e.g., plasma etching.

The gas supply mechanism 49 includes an HF gas supply path 51 for supplying an HF gas, an $F_2$ gas supply path 53 for supplying an $F_2$ gas, an $NH_3$ gas supply path 55 for supplying an $NH_3$ gas, an Ar gas supply path 57 for supplying an Ar gas as an inert gas, and an $N_2$ gas supply path 59 for supplying an $N_2$ gas. All of the gases from the gas supply paths are supplied into the shower head 45b, the gas introduction portion 45d, and the process container 41. All of the HF gas supply path 51, the $F_2$ gas supply path 53, the $NH_3$ gas supply path 55, the Ar gas supply path 57, and the $N_2$ gas supply path 59 are connected to the gas introduction portion 45d of the shower head 45b. Thus, an HF gas, an $F_2$ gas, an $NH_3$ gas, an Ar gas, and an $N_2$ gas are each injected and diffused into the process container 41 through the shower head 45b.

The gas supply mechanism 49 further includes an HF gas supply source 61, an $F_2$ gas supply source 63, an $NH_3$ gas supply source 65, an Ar gas supply source 67, and an $N_2$ gas supply source 69. Further, these gas supply sources may be external gas supply sources, instead of being the components of the modification processing device 40.

The HF gas supply path 51 is connected to the HF gas supply source 61. Further, a flow rate regulating valve 71 that can open and close a flow path and regulate a supply flow rate of an HF gas is installed in the HF gas supply path 51.

The $F_2$ gas supply path 53 is connected to the $F_2$ gas supply source 63. Further, a flow rate regulating valve 73 that can perform an opening and closing operation of a flow path and regulate a supply flow rate of an $F_2$ gas is installed in the $F_2$ gas supply path 53.

The $NH_3$ gas supply path 55 is connected to the $NH_3$ gas supply source 65. Further, a flow rate regulating valve 75 that can perform an opening and closing operation of a flow path and regulate a supply flow rate of an $NH_3$ gas is installed in the $NH_3$ gas supply path 55.

The Ar gas supply path 57 is connected to the Ar gas supply source 67. Further, a flow rate regulating valve 77 that can perform an opening and closing operation of a flow path and regulate a supply flow rate of an Ar gas is installed in the Ar gas supply path 57.

The $N_2$ gas supply path 59 is connected to the $N_2$ gas supply source 69. Further, a flow rate regulating valve 79 that can perform an opening and closing operation of a flow path and regulate a supply flow rate of an $N_2$ gas is installed in the $N_2$ gas supply path 59.

Further, the modification processing device 40 has an exhaust mechanism 81 for evacuating the interior of the process container 41. The exhaust mechanism 81 includes an exhaust path 83, a switching valve 85 installed in the exhaust path 83, and a vacuum pump 87 for forcible evacuation. An end of the exhaust path 83 is connected to the opening 43d of the bottom portion 43a of the process container 41.

A pressure gauge 89 for measuring an internal pressure of the process container 41 is installed in the sidewall 43b of the process container 41.

<Control Unit>

Figure 4:
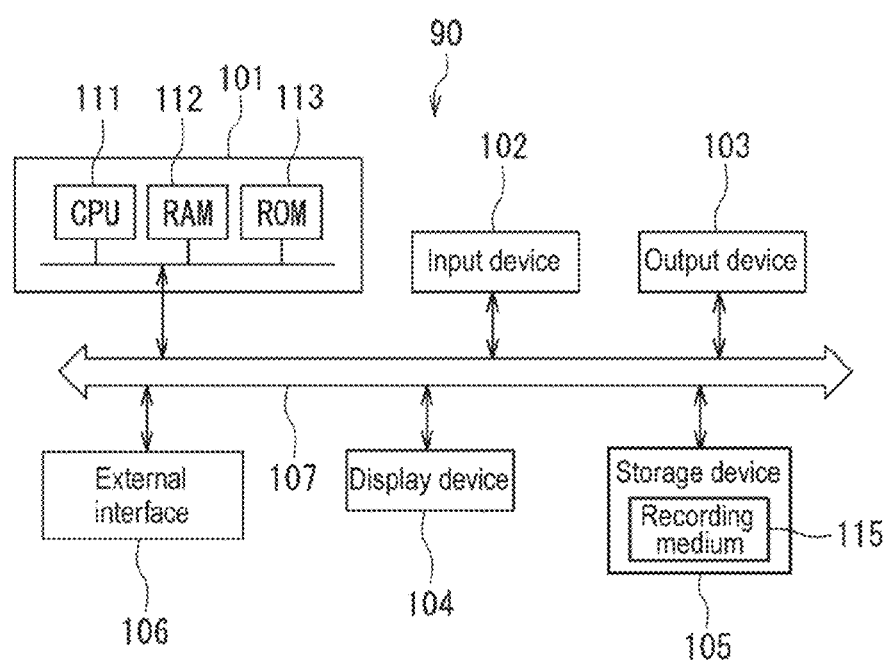
FIG. 4 is a block diagram illustrating an example of a hardware configuration of a control unit in the substrate processing system of FIG. 1.

Each of the components of the substrate processing system 100 is connected to and controlled by a control unit 90. The control unit 90 is typically a computer. FIG. 4 is a view illustrating an example of a hardware configuration of the control unit 90 illustrated in FIG. 1. The control unit 90 includes a main control unit 101, an input device 102 such as a keyboard or a mouse, an output device 103 such as a printer, a display device 104, a storage device 105, an external interface 106, and a bus 107 for connecting these components. The main control unit 101 has a central processing unit (CPU) 111, a random access memory (RAM) 112, and a read-only memory (ROM) 113. The storage device 105 may be any type of device as long as it can store information therein, and may be, for example, a hard disk device or an optical disk device. Further, the storage device 105 writes information to a computer-readable recording medium 115 or read information from the recording medium 115. The recording medium 115 may be any type of medium as long as it can store information, and may be, for example, a hard disk, an optical disk, a flash memory, or the like. The recording medium 115 may be a recording medium that stores a recipe for the modification processing method according to the present embodiment.

In the control unit 90, the CPU 111 uses the RAM 112 as an operative region and executes a program stored in the ROM 113 or the storage device 105, thereby executing the processes with respect to the wafer W in the substrate processing system 100 of the present embodiment. Specifically, the control unit 90 controls the components related to process conditions such as, e.g., a temperature of the wafer W, a process pressure, and a gas flow rate in the substrate processing system 100. For example, the control unit 90 controls the gas supply mechanism 49 such that a process gas such as an HF gas, an $F_2$ gas, an $NH_3$ gas, or an Ar gas is supplied at a predetermined flow rate and in a predetermined ratio of flow rate in the modification processing device 40. Further, the control unit 90 can monitor pressure within the process container 41 via a detection value of the pressure gauge 89 or control a supply flow rate of a gas by the gas supply mechanism 49, an exhaust amount of the exhaust mechanism 81, or the like based on the corresponding detection value.

<Processing Operation>

Next, a processing operation of the substrate processing system 100 will be described. First, a structure of the wafer W processed by the substrate processing system 100 will be described with reference to FIG. 5.

Figure 5:
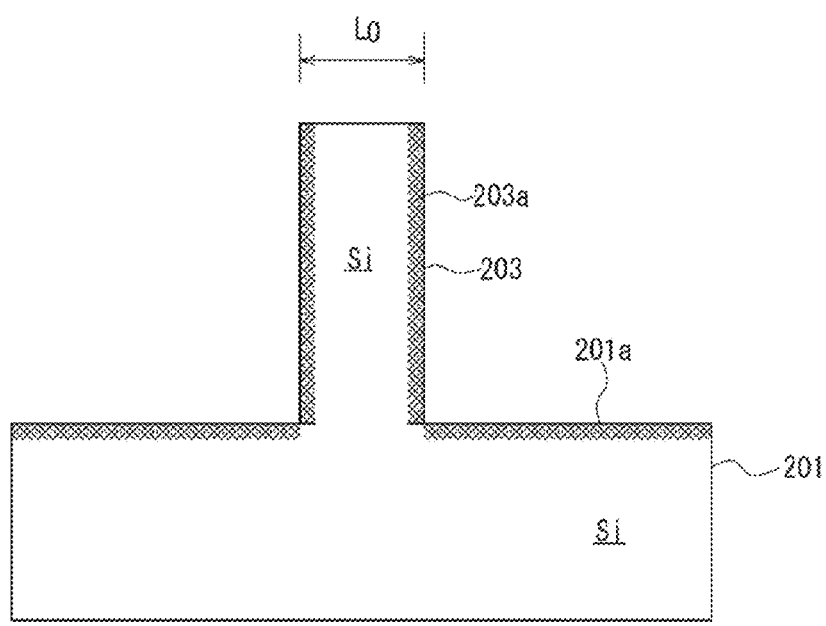
FIG. 5 is a cross-sectional view of a major part of a surface portion of a semiconductor wafer processed by the substrate processing system of FIG. 1.

FIG. 5 is a cross-sectional view of a major part of a surface portion (a device formation surface) of the wafer W. In the wafer W, a plurality of silicon walls 203 (only one silicon wall is illustrated in FIG. 5) which are pin-shaped convex portions is formed on a silicon substrate 201.

The silicon wall 203 is formed by, e.g., forming a resist layer on the silicon substrate 201 and then performing plasma etching having high anisotropy using a photolithography technology. The silicon wall 203 of FIG. 5 can be used to form, e.g., a channel portion of a FinFET. The silicon wall 203 corresponds to a "silicon layer" of the present disclosure. Through plasma etching, a thin damage layer 203a is formed on a sidewall of the silicon wall 203. The substrate processing system 100 may be used for the purpose of removing the damage layer 203a in some embodiments. Further, a thin damage layer 201a is also formed on a surface of the silicon substrate 201 through plasma etching, and the damage layer 201a can also be removed simultaneously with the damage layer 203a.

The wafer W having the structure illustrated in FIG. 5 is loaded into the carrier 13 and transferred to the substrate processing system 100. In the substrate processing system 100, one wafer W is transferred to the load lock device 20 by either of the transfer arms 11a and 11b of the atmospheric side wafer transfer device 11 from the carrier 13 of the loading/unloading device 10 in a state where the atmospheric side gate valve GV1 is opened. Thereafter, the wafer W is transferred to the hand 19a of the wafer transfer device 19 of the load lock device 20.

Subsequently, the atmospheric side gate valve GV1 is closed and the interior of the load lock device 20 is vacuum-evacuated. Thereafter, the gate valves GV2 and GV3 are opened and the hand 19a moves up to the modification processing device 40 to load the wafer W on the loading table 42.

Subsequently, the hand 19a is returned to the load lock device 20 and the gate valve GV3 is closed, whereby the interior of the process container 41 of the modification processing device 40 is sealed. Thereafter, modification process on the wafer W is started by introducing a process gas into the process container 41 from the gas supply mechanism 49. That is, by introducing a process gas into the process container 41, the damage layer 201a on the wafer W and the damage layer 203a of the silicon wall 203 are removed. At this time, a temperature of the wafer W is adjusted to a predetermined range by the temperature adjusting unit 47 and the interior of the process container 41 is adjusted to a predetermined pressure by the exhaust mechanism 81.

Further, in the case of performing PHT as part of the modification processing, for example, the PHT may be performed in the following order. After the processing by the modification processing device 40, the gate valves GV2 and GV3 are opened, and the processed wafer W on the loading table 42 is received by the hand 19a of the wafer transfer device 19. Thereafter, the wafer W is loaded on the loading table 32 within the process container 31 of the PHT device 30. Subsequently, after the hand 19a is moved back to the load lock device 20 and the gate valves GV2 and GV3 are closed, the wafer W on the loading table 32 is heated by the heater 33, while an $N_2$ gas is introduced into the process container 31. Accordingly, a reaction product generated in the process of the modification process is heated and vaporized and is finally exhausted and removed from the process container 31.

Figure 6:
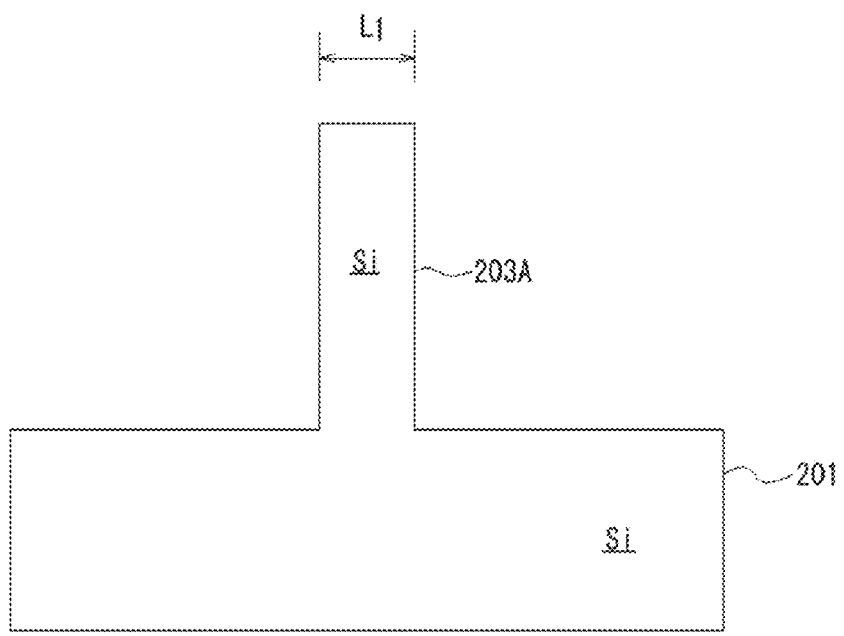
FIG. 6 is a cross-sectional view of the major part of the surface portion of the semiconductor wafer illustrating a state in which a damage layer has been removed from the state of FIG. 5 through modification processing.

Through the foregoing modification processing, a silicon wall 203A is formed on the wafer W. FIG. 6 is a view illustrating a state in which the damage layer 201a and the damage layer 203a were removed by the substrate processing system 100 from the state of FIG. 5. In the substrate processing system 100, the damage layer 201a and the damage layer 203a can be removed with good controllability on a nm thickness level. A thickness $L_1$ of the silicon wall 203A available after the damage layer 203a is removed, is smaller than a thickness $L_0$ of the silicon wall 203 before the damage layer 203a is removed.

After the process as described above, the wafer W is accommodated in the load lock device 20 by the hand 19a of the wafer transfer device 19. Thereafter, the load lock device 20 is returned to an atmospheric state after closing the gate valve GV2, and the wafer W is received by the carrier 13 of the loading/unloading device 10 by the atmospheric side wafer transfer device 11.

The foregoing operation is repeatedly performed on the wafer W received in the carrier 13 under the control of the control unit 90, thereby performing sequential processing on a predetermined number of wafers W. Further, in the present disclosure, the "silicon layer" may be a silicon substrate or a silicon film having a pattern such as a fine line & space, or having a three-dimensional structure such as a fine convex shape or concave shape. Further, the silicon layer may be formed on an insulating film.

Modification Processing Method of First Embodiment

Figure 7:
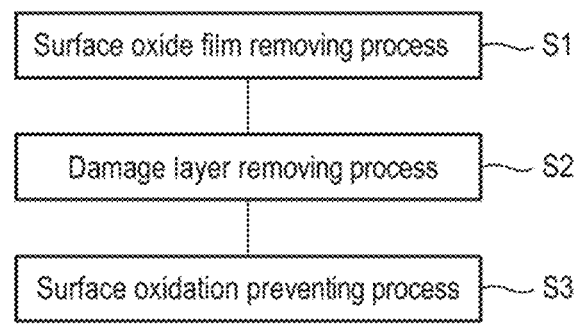
FIG. 7 is a flowchart illustrating an example of a process sequence of a modification processing method according to a first embodiment of the present disclosure.
Figure 8:
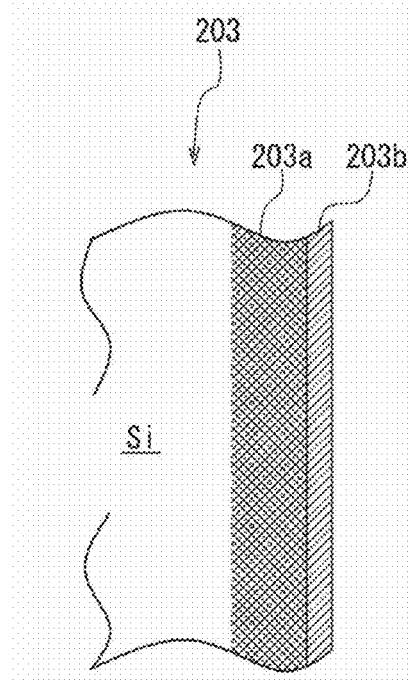
FIG. 8 is an enlarged cross-sectional view illustrating the major part of the semiconductor wafer on which the damage layer is formed.
Figure 9:
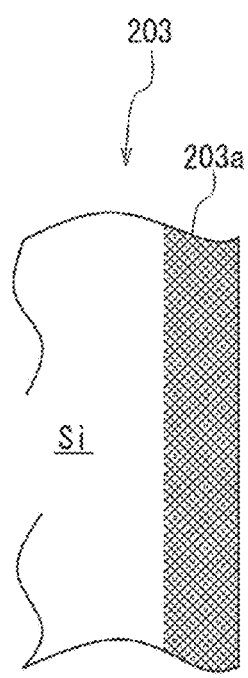
FIG. 9 is an enlarged cross-sectional view illustrating the major part of the semiconductor wafer in a state in which a surface oxide film was removed during modification processing.
Figure 10:
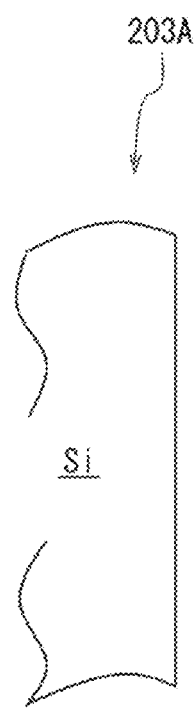
FIG. 10 is an enlarged cross-sectional view illustrating the major part of the semiconductor wafer in a state in which the damage layer was removed after the state shown in FIG. 9.

Hereinafter, details of a modification processing method of a first embodiment performed in the substrate processing system 100 will be described with reference to FIGS. 7 to 10. FIG. 7 is a flowchart illustrating an example of a process sequence of the modification processing method of this embodiment. FIG. 8 is an enlarged cross-sectional view illustrating the major part of the wafer W on which the damage layer is formed. FIG. 9 is an enlarged cross-sectional view illustrating the major part of the wafer W in the middle of the modification process. FIG. 10 is an enlarged cross-sectional view illustrating the major part of the wafer W in which the damage layer was removed, from the state of FIG. 9. Further, process conditions described hereinafter are conditions for the case where a wafer W having a diameter equal to 300 mm is a target object.

The modification processing method of this embodiment performed in the substrate processing system 100 may include processes of step S1 to step S3 illustrated in FIG. 7. First, a wafer W with a damage layer formed thereon is prepared. Here, the target object to be processed is the wafer W as illustrated in FIG. 5. That is, a wafer W in which a plurality of silicon walls 203 having a fin shape are formed on the silicon substrate 201 and a damage layer 203a is present on the side portion thereof is prepared. FIG. 8 is an enlarged cross-sectional view of the damage layer 203a formed on the sidewall of the silicon wall 203. The damage layer 203a of silicon formed by plasma includes a mixture layer of, e.g., crystal and amorphous (or a distorted layer of crystal). Further, when the wafer W is exposed to an atmospheric environment after plasma etching, a surface oxide film 203b, which is an amorphous and naturally oxidized, may be formed on an outer side (surface) of the damage layer 203a in some cases.

<Step S1>

First, step S1 is a surface oxide film removing process for removing the surface oxide film 203b. The removing of the surface oxide film 203b may be performed by using a process gas containing, e.g., an HF gas and $NH_3$, in the modification processing device 40. An HF gas, an $NH_3$ gas, an Ar gas, and an $N_2$ gas are introduced from the HF gas supply source 61, the $NH_3$ gas supply source 65, the Ar gas supply source 67, or the $N_2$ gas supply source 69 into the process container 41 of the modification processing device 40 through the shower head 45b by the gas supply mechanism 49.

In removing the surface oxide film 203b in step S1, a flow rate of the HF gas is within a range from, e.g., 20 to 300 mL/min (sccm) in some embodiments. Further, a flow rate of the $NH_3$ gas is within a range from 20 to 300 mL/min (sccm) in some embodiments. Further, flow rates of the Ar gas or $N_2$ gas is within a range from, e.g., 10 to 1000 mL/min (sccm) in some embodiments. Here, a ratio (HF:$NH_3$) of the flow rates of the HF gas and the $NH_3$ gas is within a range from, e.g., 1:10 to 10:1, in some embodiments, in order to control selectivity and a reaction speed.

Further, in removing the surface oxide film 203b in step S1, an internal pressure of the process container 41 is within a range from, e.g., 2.7 to 266 Pa, in some embodiments, in terms of controlling a reaction speed.

Further, in removing the surface oxide film 203b in step S1, in some embodiments, a temperature of the wafer W is within a range from, e.g., 20 to 120 degrees C., as a temperature of the loading table 42 in terms of controlling selectivity.

In step S1, $SiO_2$ forming the surface oxide film 203b is changed into ammonium silicofluoride [$(NH_4)_2SiF_6$] or water, as a reaction product, by a reaction between the HF gas and the $NH_3$ gas. The generated water is confined in a film of the reaction product and held on the surface of the wafer W, rather than being spread from the surface of the wafer W.

In step S1, after the foregoing processing in the modification processing device 40 is terminated, PHT processing is performed by the PHT device 30 in some embodiments. That is, step S1 may include the PHT processing. The PHT may be performed in the following order. First, after the gate valves GV2 and GV3 are opened, the processed wafer W is transferred from the loading table 42 of the modification processing device 40 by the hand 19a of the wafer transfer device 19, and is moved to and mounted on the loading table 32 of the process container 31 of the PHT device 30. Thereafter, the hand 19a is moved back to the load lock device 20, and the gate valves GV2 and GV3 are closed. Subsequently, while the $N_2$ gas is introduced into the process container 31 from the gas supply source 34 of the PHT device 30, the wafer W on the loading table 32 is heated by the heater 33.

In the PHT processing in step S1, a flow rate of the $N_2$ gas is within a range from, e.g., 500 to 2000 mL/min (sccm) in some embodiments.

Further, in the PHT processing in step S1, the internal pressure of the process container 31 is set to a range from, e.g., 13 to 266 Pa, in some embodiments, in terms of a rise in temperature of a reaction product and sublimation efficiency.

Further, in the PHT processing in step S1, a temperature of the wafer W is within a range from, e.g., 100 to 300 degrees C., as a temperature of the loading table 32, in some embodiments, in terms of efficient removal of ammonium silicofluoride or water through vaporization.

In step S1, by performing the foregoing PHT processing, a reaction product generated by a reaction between the HF gas and the $NH_3$ gas in the modification processing device 40 is heated and vaporized so as to be removed from the upper portion of the wafer W (the silicon wall 203). As described above, the surface oxide film 203b of the silicon wall 203 is removed by step S1, as illustrated in FIG. 9.

Further, if the wafer W is not exposed to an atmospheric environment after the plasma etching and the surface oxide film 203b is not formed on the outer side (surface) of the damage layer 203a, removing the surface oxide film 203b may be omitted in step S1.

<Step S2>

Step S2 is a damage layer removing process of removing the damage layer 203a. The removing of the damage layer 203a may be performed using a process gas containing, e.g., an $F_2$ gas, in the modification processing device 40. By the gas supply mechanism 49, an $F_2$ gas and an Ar gas from the $F_2$ gas supply source 63 and the Ar gas supply source 67, or if necessary, an $NH_3$ gas and an $N_2$ gas from the $NH_3$ gas supply source 65 and the $N_2$ gas supply source 69 are introduced into the process container 41 of the modification processing device 40 through the shower head 45b. Further, in step S2, the introduction of the $NH_3$ gas and the $N_2$ gas may be arbitrarily made and the $NH_3$ gas and the $N_2$ gas may not be used. Using the $NH_3$ gas together with the $F_2$ gas can improve a removal rate of the damage layer 203a.

In removing the damage layer 203a in step S2, the $F_2$ gas preferably, in some embodiments, does not contain an $N_2$ gas. Normally, an $F_2$ gas is handled in the form of a mixture gas in which an $N_2$ gas as a dilution gas is mixed in an amount of about 80 volume %, for the purpose of securing safety. However, in removing the damage layer 203a by the modification processing device 40, when the $N_2$ gas is present within the process container 41, roughness of the silicon surface (the surface of the silicon wall 203A) after the removing of the damage layer 203a is degraded. Thus, in the present embodiment, an $N_2$-free $F_2$ gas (the content of $F_2$: 20 volume %) in which a noble gas as a dilution gas such as an Ar gas is mixed in an amount of about 80 volume % is used. Further, for the same reason, an $N_2$ gas is not introduced from the $N_2$ gas supply source 69.

In the removing of the damage layer 203a in step S2, a flow rate of the $F_2$ gas (the content of $F_2$: 20 volume %) is within a range from, e.g., 100 to 1000 mL/min (sccm) in some embodiments. Further, a flow rate of the Ar gas is within a range from, e.g., 500 to 1500 mL/min (sccm) in some embodiments. Here, a ratio ($F_2$:Ar) of the flow rates between the $F_2$ gas (the content of $F_2$: 20 volume %) and the Ar gas is within a range from, e.g., 1:5 to 5:1, in some embodiments, in terms of controlling an etching amount and roughness.

Further, in the removing of the damage layer 203a in step S2, a flow rate of the $NH_3$ gas when it is introduced is within a range from, e.g., 1 to 30 mL/min (sccm) in some embodiments. In this case, a ratio ($F_2$:$NH_3$) of the flow rates between the $F_2$ gas (the content of $F_2$: 20 volume %) and the $NH_3$ gas is within a range from, e.g., 100:1 to 3:1, in some embodiments, in terms of enhancing a removal rate of the damage layer 203a.

Further, in the removing of the damage layer 203a in step S2, a flow rate of the $N_2$ gas when it is introduced can be within a range from, e.g., 100 to 1500 mL/min (sccm). However, as described above, avoiding using the $N_2$ gas is necessary in order to reduce roughness of the silicon surface.

Further, in the removing of the damage layer 203a in step S2, the internal pressure of the process container 41 is within a range from, e.g., 133 to 677 Pa, in terms of an etching amount and roughness. Further, in step S2, the internal pressure of the process container 41 may be changed in the middle of processing, and this will be described later.

Further, in the removing of the damage layer 203a in step S2, a temperature of the wafer W is within a range from, e.g., 30 to 120 degrees C., as a temperature of the loading table 42, in some embodiments, in terms of an etching amount and selectivity.

In step S2, Si forming the damage layer 203a is changed to SiF, $SiF_2$, and $SiF_3$ as reaction products, and finally to $SiF_4$ that can be easily vaporized, by a reaction between the Si and the $F_2$ gas. Further, in step S2, when the $NH_3$ gas is added, Si is changed into ammonium silicofluoride [$(NH_4)_2SiF_6$] as a reaction product via a reaction between the silicon with the $F_2$ gas and the $NH_3$ gas. In this manner, by step S2, the damage layer 203a of the silicon wall 203 is removed to form the silicon wall 203A without damage as illustrated in FIG. 10.

<Step S3>

Step S3 is a surface oxidation preventing process of preventing the silicon surface of the silicon wall 203A after the removing of the damage layer 203a from being naturally oxidized. A very small amount of F atom originated from $F_2$ used to remove the damage layer 203a in step S2 is present in the silicon wall 203A. The F atom may cause the surface of the silicon wall 203A to be oxidized. In the surface oxidation preventing process of step S3, a process gas containing HF and $NH_3$ is used to dissociate an Si—F bond on the surface of the silicon wall 203A, and instead, an Si—H bond is generated by terminating a hydrogen atom. Thus, a stabilized surface state difficult to oxidize is obtained.

The surface oxidation preventing process of step S3 may be performed under the same conditions as those of step S1 and in the same order as that of step S1 and may use the same process gas as that of step S1.

Further, in step S3, PHT processing is performed by the PHT device 30 in some embodiments after the modification process in the modification processing device 40 is completed. That is, step S3 may include the PHT processing. The conditions and order when the PHT processing is performed are also the same as those of step S1. Through the PHT processing, a reaction product or water generated by the reaction with the HF gas and the $NH_3$ gas can be heated and vaporized so as to be removed from the upper portion (the silicon wall 203A) of the wafer W.

In addition, when the wafer W after step S2 is moved to a heterogeneous process (for example, a film formation process, etc.) while maintaining a state where the wafer W is not exposed to an atmospheric environment and vacuum atmosphere is maintained, the surface oxidation preventing process of step S3 may be omitted.

Modification Processing Method of Second Embodiment

Next, a modification processing method of a second embodiment performed in the substrate processing system 100 will be described with reference to FIG. 11. The modification processing method of this embodiment may include the processes of step S1 to step S3 (see FIG. 7). Further, in this embodiment, an internal pressure of the process container 41 is changed during step S2. The modification processing method of this embodiment may be performed in the same manner as that of step S2 in the modification processing method of the first embodiment, except that the internal pressure is changed during step S2. Further, the order and conditions of step S1 and step S3 in this embodiment are the same as those of the modification processing method of the first embodiment, and thus, a description thereof will be omitted.

FIG. 11 is a timing chart illustrating an introduction timing of a process gas and a change in an internal pressure (process pressure) of the process container 41 in step S2 of the modification processing method of the second embodiment. As illustrated in FIG. 11, step S2 of this embodiment starts from a time $t_1$. That is, by the gas supply mechanism 49, for example, the $F_2$ gas, the $NH_3$ gas, and the Ar gas are introduced into the process container 41 of the modification processing device 40 through the shower head 45b from the time $t_1$. Further, in step S2 of this embodiment, the introduction of the $NH_3$ gas is arbitrarily made, and the $NH_3$ gas may not be used. Further, the $N_2$ gas may be introduced.

In step S2 of this embodiment, while the process gas is continuously introduced, a process pressure is changed. For example, as illustrated in FIG. 11, the process pressure is set to two steps of "high" (high pressure step) and "low" (low pressure step), and the process pressure is changed at every predetermined time. In FIG. 11, a period from $t_1$ to $t_2$ and a period from $t_3$ to $t_4$ are high pressure steps, and a period from $t_2$ to $t_3$ and a period from $t_4$ to $t_5$ are low pressure steps. Here, the terms of "high pressure" and "low pressure" are merely used as having a relative meaning. In the high pressure step, a removal rate of the damage layer 203a may be increased, but the roughness of the surface of the silicon wall 203A after removing the damage layer 203a tends to increase. In the low pressure steps, a removal rate of the damage layer 203a is small, but the roughness of the surface of the silicon wall 203A after the removing of the damage layer 203a may be suppressed to obtain a smooth surface. Thus, by alternately repeating the high pressure step and the low pressure step, the removal efficiency of the damage layer 203a can be increased to improve the overall throughput of step S2 while maintaining the smoothness of the surface of the silicon wall 203A. When the silicon wall 203A is used as a Fin channel of a FinFET, the smoothing of the surface of the silicon wall 203A reduces an interface state and thus enhances electrical characteristics and reliability of the FinFET.

A process pressure $P_H$ in the high pressure step in step S2 of this embodiment is within a range from, e.g., 400 Pa to 667 Pa, in some embodiments, in order to sufficiently increase a removal rate of the damage layer 203a. Further, a process pressure $P_L$ in the low pressure step is within a range from, e.g., 133 Pa to 400 Pa, in some embodiments, in order to reduce the roughness of the surface of the silicon wall 203A after the removing of the damage layer 203a, thereby making the surface as smooth as possible by (but, a case in which the process pressure is $P_H=P_L$ is excluded). Further, a pressure difference between the process pressure $P_H$ and the process pressure $P_L$ is equal to or greater than, e.g., 133 Pa in some embodiments.

In step S2 of this embodiment, the high pressure step and the low pressure step may be repeated a plurality of times, e.g., about 2 to 20 times. Further, in FIG. 11, the process pressure is changed between two steps of high pressure and low pressure, but the process pressure may also be changed between three or more steps. Further, the change in the process pressure is not limited to the method of changing in a step shape and, for example, a method of slantingly changing (gradually increasing or decreasing) the process pressure may also be used.

Other components and effects in this embodiment are the same as those of the first embodiment.

EXAMPLES

Subsequently, the present disclosure will be described in more detail through examples, but the present disclosure is not limited to the following examples.

Example 1

Preparation of Sample

A sample in which a plasma damage layer was formed was prepared through the following method. An Si substrate was pre-cleaned using dilute hydrofluoric acid (HF:water=1:200) for 3 minutes. A plasma etching process was performed on the Si substrate using a plasma etching device [SCCM (registered trademark) manufactured by TOKYO ELECTRON LTD.]. Plasma etching was performed using only Ar in an amount of 300 mL/min (sccm) as a process gas under a process pressure of 4 Pa (30 mTorr), while applying a high frequency of 13.45 MHz, 500 W to a lower electrode of the plasma etching device.
<Removal Process of Damage Layer>

Modification processing was performed on the sample by performing the processes of step S1 to step S3 (see FIG. 7) by using the substrate processing system 100 having the same configuration as that illustrated in FIG. 1. Details of each step are as follows.
(Step S1)

80 mL/min (sccm) of HF gas, 80 mL/min (sccm) of $NH_3$ gas, and 68 mL/min (sccm) of $N_2$ gas were each introduced into the process container 41 of the modification processing device 40. A process pressure was 2.7 Pa (20 mTorr), a process temperature was 35 degrees C., and a process time was one minute.

After the processing in the modification processing device 40 was terminated, PHT processing was performed using the PHT device 30. 1000 mL/min (sccm) of $N_2$ gas was introduced as a process gas into the process container 31 of the PHT device 30, and a process pressure was 90 Pa (675 mTorr), a process temperature was 190 degrees C., and a process time was 2 minutes.
(Step S2)

180 mL/min (sccm) of $F_2$ gas, 1200 mL/min (sccm) of Ar gas, and 5 mL/min (sccm) of $NH_3$ gas were each introduced into the process container 41 of the modification processing device 40. Further, as the $F_2$ gas, an $N_2$-free mixture gas of 20 volume % of $F_2$ content and 80 volume % of Ar content was used. Thereafter, a process at a process pressure equal to 533 Pa (4 Torr) for 8 seconds and a process at a process pressure equal to 267 Pa (2 Torr) for 8 seconds were alternately repeated 10 cycles. A process temperature was 80 degrees C.
(Step S3)

Same processes as those in step S1 were performed.

Figure 12:
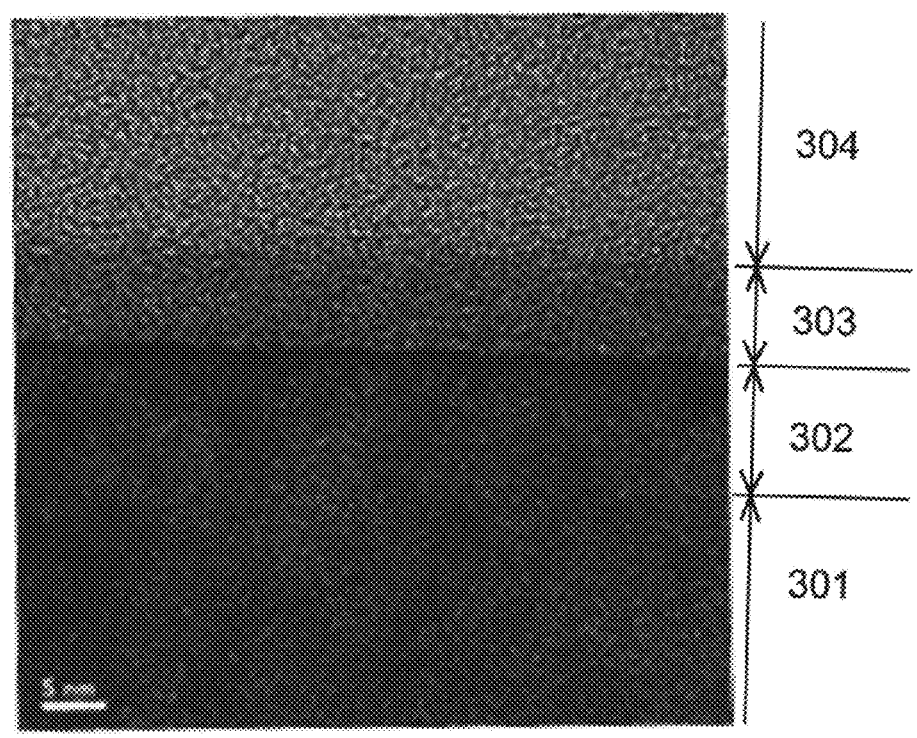
FIG. 12 is a transmission electron microscope (TEM) image of a cross-section of a surface of an Si substrate before the modification processing is performed in Embodiment 1.
Figure 13:
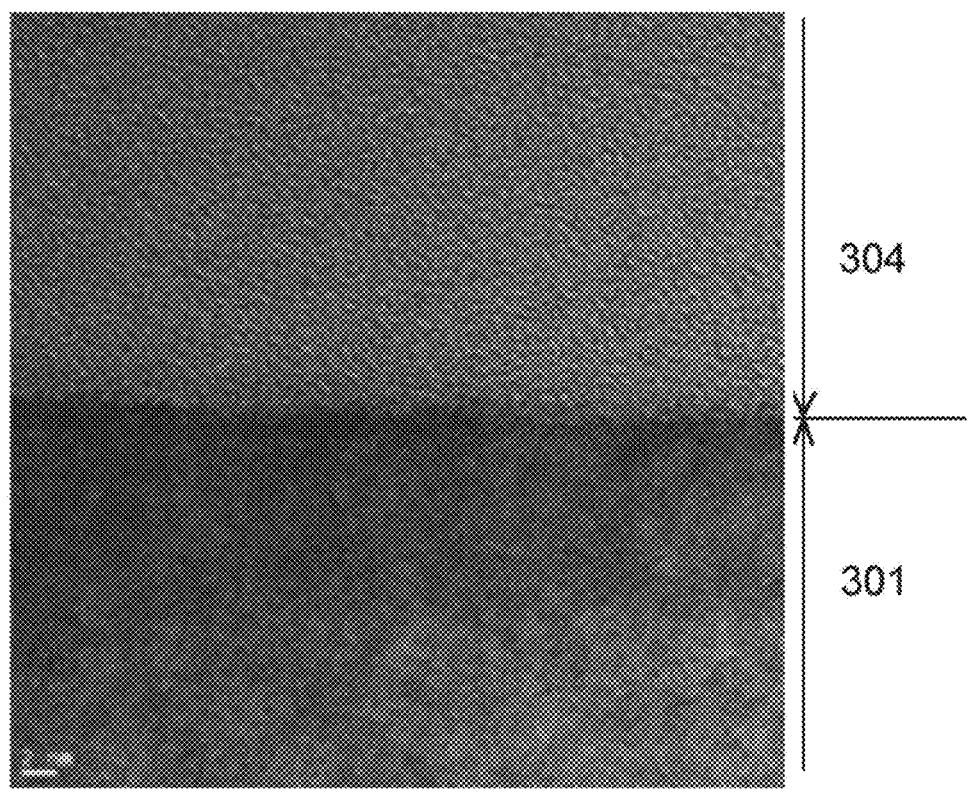
FIG. 13 is a TEM image of a cross-section of the surface of the Si substrate after the modification processing in Embodiment 1.

FIG. 12 is a transmission electron microscope (TEM) image of a cross-section of a surface of the sample (Si substrate) before the modification process of step S1 to step S3 is performed. Meanwhile, FIG. 13 is a TEM image of a cross-section of the surface of the sample (the Si substrate) after the modification process of step S1 to step S3 is performed. In the blank spaces of FIGS. 12 and 13, reference numeral 301 denotes an Si substrate, reference numeral 302 denotes a damage layer, reference numeral 303 denotes a surface oxide film, and reference numeral 304 denotes a protective film. In FIGS. 12 and 13, the surfaces of the samples (Si substrate) are covered with the protective film 304. From the comparison of FIGS. 12 and 13, the damage layer 302 was removed and the surface oxide film 303 was also removed by performing the modification process of step S1 to step S3. Further, from FIG. 13, it can be seen that, the surface roughness of a nanometer level was not observed in the surface of the Si substrate 301 and a smooth Si surface was formed.

Example 2

Step S1 (surface oxide film removing process) and step S2 (damage layer removing process) were performed on the same sample as that of Example 1 by performing by using the substrate processing system 100 having the same configuration as that illustrated in FIG. 1. Details of each step are as follows. Further, step S3 (surface oxidation preventing process) was not performed.
(Step S1)

Same processes as those in step S1 of Example 1 were performed.
(Step S2)

180 mL/min (sccm) of $F_2$ gas, 399 mL/min (sccm) of Ar gas, 800 mL/min (sccm) of $N_2$ gas, and 30 mL/min (sccm) of $NH_3$ gas were each introduced into the process container 41 of the modification processing device 40. Further, as the $F_2$ gas, a mixture gas of 20 volume % of $F_2$ content and 80 volume % of $N_2$ content was used. Thereafter, a process at a process pressure equal to 533 Pa (4 Torr) for 10 seconds and a process at a process pressure equal to 267 Pa (2 Torr) for 10 seconds were alternately repeated 3 cycles. A vacuum exhaust was performed for 15 seconds between the cycles. A process temperature was 80 degrees C.

Experimental Example 1

Evaluation of Electrical Characteristics

A MOS capacitor was manufactured using the samples (Si substrates) on which the modification processes of Examples 1 and 2 were performed and electrical characteristics thereof were evaluated. First, a silicon oxide film having a thickness equal to 6 nm was deposited on an Si substrate at a process temperature equal to 350 degrees C. through an atomic layer deposition (ALD) method. A TiN electrode film having a thickness equal to 30 nm was formed on the silicon oxide film through a physical vapor deposition (PVD) method. Subsequently, the backside oxide film of the Si substrate was processed with dilute fluoride acid (HF:water=1:200) and was removed. Thereafter, a photoresist layer was stacked on the TiN electrode film, and then, the TiN electrode film was patterned through a photolithography process and wet etching with hydrogen peroxide water. A remaining photoresist layer was removed and then an annealing process was performed at 450 degrees C. for 30 minutes under a forming gas (a mixture gas of $N_2$ and $H_2$) environment to terminate a dangling bond.

After the MOS capacitor was manufactured as described above, CV characteristics and IV characteristics thereof were evaluated. Further, for a comparison purpose, a MOS capacitor was similarly manufactured with respect to a sample (Comparative Example 1) on which no processes of step S1 to step S3 was performed, and electrical characteristics thereof were evaluated. FIG. 14 illustrates CV characteristics of the MOS capacitors manufactured using the samples of Example 1 (curve A), Comparative Example 1 (curve B), and Example 2 (curve C).

From FIG. 14, it can be seen that, in Example 1 (curve A) in which the modification process of step S1 to step S3 was performed, film growth of a silicon oxide film was suppressed, capacitance in an accumulation side did not degrade, a rise of the CV curve was steep and no hump was shown. Further, although not shown, the leakage of the IV characteristics was also considerably improved, thereby exhibiting the inherent characteristics of the silicon oxide film formed by the ALD method.

Meanwhile, the CV characteristics (curve C) of the MOS capacitor of Example 2 in which step S2 was performed under conditions different from those of Example 1 and in which the process of step S3 was omitted were significantly improved, compared with Comparative Example 1 (curve B), thereby confirming the effect of removing a damage layer. However, when Example 2 (curve C) is compared with Example 1 (curve A), the capacitance of the accumulation side was reduced and the silicon oxide film was increased in thickness in Example 2. In Example 2, a time elapsed from the modification process to the gate oxidation was restrained to be within 6 hours. The silicon oxide film was considered to be increased in thickness for that time. This shows that it is preferred in some embodiments to perform the oxidation preventing process (step S3) after the removing of the damage layer in step S2. Further, in Example 2 (curve C), a slope of the rising portion of the CV curve is small and a hump was generated. This is considered that, since a process gas containing an $N_2$ gas was used in step S2 of Example 2, the surface roughness is generated on the Si surface of the Si substrate, and thus, an influence of an interface state resulting therefrom appears.

Evaluation of Roughness:

Roughness of the Si surface of the sample (Si substrate) on which the modification processing of Example 1 was performed was measured. Sample 1A is a sample which is maintained in a vacuum state to avoid exposure in the atmospheric environment between step S1 (surface oxide film removing process) and step S2 (damage layer removing process) of Example 1. Sample 1B is a sample which is exposed in the atmospheric environment between step S1 (surface oxide film removing process) and step S2 (damage layer removing process) of Example 1. Roughness measurement results of each of the samples are illustrated in Table 1.

TABLE 1

|  | Rq (nm) (root mean square height) | Ra (nm) (arithmetic average roughness) |
|---|---|---|
| Sample 1A | 0.21 | 0.16 |
| Sample 1B | 0.41 | 0.33 |

As seen from Table 1, the Si surface that was maintained in a vacuum state between step S1 (surface oxide film removing process) and step S2 (damage layer removing process) had smaller roughness and was more smoothened. Thus, it was confirmed that, in order to suppress the roughness of the Si surface to a small extent and reduce an interface state, the modification process of step S1 to step S3 is performed under a vacuum state using the substrate processing system 100 of FIG. 1.

From the above results, it can be confirmed that the damage layer formed on the silicon layer by plasma irradiation can be reliably removed by performing the modification process of the present disclosure, and that the modification process of the present disclosure can also reduce the roughness of the silicon surface under preferred conditions.

As described above, through the modification processing method of the present disclosure, plasma damage on the substrate can be effectively removed without causing an increase of a thermal budget or pattern collapse. Thus, a semiconductor device having high reliability can be obtained by applying the modification processing method of the present disclosure to removing a damage layer of a fine silicon pattern during a process of manufacturing a 3D device such as, e.g., a FinFET, a bit cost scalable (BiCS) flash memory, a vertical gate (VG)-NAND flash memory.

While the embodiments of the present disclosure have been described above in detail for the sake of illustration, the present disclosure is not limited to the foregoing embodiments and may be variously modified. For example, in the foregoing embodiments, the semiconductor wafer was taken as an example as a substrate to be processed, but a substrate used for manufacturing, e.g., a flat panel display (FPD) represented by a liquid crystal display (LCD), a solar cell, or the like, may also be used as the substrate.

Moreover, in the substrate processing system 100 of FIG. 1, the example of processing one wafer each time within the process container has been described, but two or more wafers W may also be simultaneously processed within the process container.

According to the present disclosure, it is possible to effectively remove plasma damage on the substrate without causing an increase of a thermal budget or pattern collapse. Thus, a semiconductor device having high reliability can be provided by applying the modification processing method of the present disclosure to remove a damage layer of a fine silicon pattern during a process of manufacturing a 3D device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A modification processing method, comprising:
preparing a substrate having a silicon layer on which a damage layer is formed through plasma processing; and
removing the damage layer formed on the silicon layer by processing the substrate with a first process gas containing a fluorine gas,
wherein removing the damage layer comprises a process at a first pressure and a second process at a second pressure different from the first pressure.

2. The method of claim 1, wherein the process at the first pressure and the process at the second pressure are repeatedly performed a plurality of times in an alternating manner.

3. The method of claim 2, wherein the first pressure is within a range from 400 Pa to 667 Pa and the second pressure is within a range from 133 Pa to 400 Pa.

4. The method of claim 1, wherein the first process gas contains a noble gas as well as the fluorine gas and does not contain a nitrogen gas.

5. The method of claim 1, wherein the first process gas further contains ammonia.

6. The method of claim 1, wherein the silicon layer has a three-dimensional shape with a concave portion or a convex portion, and the damage layer is formed on the side of the concave portion or the convex portion.

7. The method of claim 1, further comprising, before removing the damage layer, removing a surface oxide film of the silicon layer by processing the substrate with a second process gas containing hydrogen fluoride.

8. The method of claim 1, further comprising, after removing the damage layer, performing a surface oxidation preventing process of the silicon layer by processing the substrate with a third process gas containing a hydrogen fluoride.

9. A method of manufacturing a semiconductor device comprising the modification processing method of claim 1.

10. A modification processing method, comprising:
preparing a substrate having a silicon layer on which a damage layer is formed through plasma processing; and
removing the damage layer formed on the silicon layer by processing the substrate with a first process gas containing a fluorine gas,
wherein the silicon layer has a three-dimensional shape with a concave portion or a convex portion, and the damage layer is formed on the side of the concave portion or the convex portion.

11. The method of claim 10, wherein removing the damage layer comprises a process at a first pressure and a second process at a second pressure different from the first pressure, and wherein the process at the first pressure and the process at the second pressure are repeatedly performed a plurality of times in an alternating manner.

12. The method of claim 10, wherein the first pressure is within a range from 400 Pa to 667 Pa and the second pressure is within a range from 133 Pa to 400 Pa.

13. The method of claim 10, wherein the first process gas contains a noble gas as well as the fluorine gas and does not contain a nitrogen gas.

14. The method of claim 10, wherein the first process gas further contains ammonia.

15. The method of claim 10, further comprising, before removing the damage layer, removing a surface oxide film of the silicon layer by processing the substrate with a second process gas containing hydrogen fluoride.

16. The method of claim 10, further comprising, after removing the damage layer, performing a surface oxidation preventing process of the silicon layer by processing the substrate with a third process gas containing a hydrogen fluoride.

17. A method of manufacturing a semiconductor device comprising the modification processing method of claim 10.

* * * * *